United States Patent
Sio et al.

(10) Patent No.: US 12,219,748 B2
(45) Date of Patent: *Feb. 4, 2025

(54) SEMICONDUCTOR DEVICE INCLUDING A DIELECTRIC LAYER BETWEEN A SOURCE/DRAIN REGION AND A SUBSTRATE

(71) Applicant: Taiwan Semiconductor Manufacturing Company Limited, Hsinchu (TW)

(72) Inventors: Kam-Tou Sio, Hsinchu (TW); Yi-Hsun Chiu, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/366,733

(22) Filed: Aug. 8, 2023

(65) Prior Publication Data

US 2023/0389259 A1 Nov. 30, 2023

Related U.S. Application Data

(63) Continuation of application No. 17/552,500, filed on Dec. 16, 2021, now Pat. No. 11,765,878, which is a (Continued)

(51) Int. Cl.
*H10B 10/00* (2023.01)
*H01L 29/423* (2006.01)
(Continued)

(52) U.S. Cl.
CPC ..... *H10B 10/125* (2023.02); *H01L 29/42392* (2013.01); *H01L 29/66795* (2013.01); *H01L 29/785* (2013.01); *H01L 29/78696* (2013.01)

(58) Field of Classification Search
CPC . H10B 10/125; H10B 10/12; H01L 29/42392; H01L 29/66795; H01L 29/785;
(Continued)

(56) References Cited

U.S. PATENT DOCUMENTS 9,570,551 B1   2/2017  Balakrishnan
10,840,146 B1  11/2020 Paul et al.
(Continued)

FOREIGN PATENT DOCUMENTS

TW     201733120    9/2017

OTHER PUBLICATIONS

Taiwanese Office Action, Application No. 109121373, dated Oct. 17, 2022.
(Continued)

*Primary Examiner* — Changhyun Yi
(74) *Attorney, Agent, or Firm* — Jones Day

(57) ABSTRACT

Devices and methods are described herein that obviate the need for a read assist circuit. In one example, a semiconductor device includes a source region and a drain region formed above a substrate. A buried insulator (BI) layer is formed beneath either the source region or the drain region. A first nano-sheet is formed (i) horizontally between the source region and the drain region and (ii) vertically above the BI layer. The BI layer reduces current flow through the first nano-sheet.

20 Claims, 8 Drawing Sheets

Related U.S. Application Data continuation of application No. 15/931,658, filed on May 14, 2020, now Pat. No. 11,239,244.

(60) Provisional application No. 62/867,315, filed on Jun. 27, 2019.

(51) Int. Cl.
  *H01L 29/66* (2006.01)
  *H01L 29/78* (2006.01)
  *H01L 29/786* (2006.01)

(58) Field of Classification Search
  CPC .......... H01L 29/78696; H01L 27/0207; H01L 29/1079

See application file for complete search history.

(56) References Cited

U.S. PATENT DOCUMENTS

| | | |
|---|---|---|
| 11,765,878 B2* | 9/2023 | Sio .................... H01L 29/66795 257/369 |
| 2012/0106236 A1 | 5/2012 | Singh et al. |
| 2018/0294331 A1 | 10/2018 | Cho et al. |
| 2019/0027535 A1 | 1/2019 | Kumar et al. |
| 2019/0057867 A1 | 2/2019 | Smith et al. |
| 2019/0081151 A1 | 3/2019 | Lee et al. |
| 2019/0131395 A1 | 5/2019 | Lee et al. |
| 2019/0189195 A1 | 6/2019 | Na et al. |
| 2020/0357884 A1 | 11/2020 | Xie et al. |

OTHER PUBLICATIONS

Chinese Office Action; Application No. 202010578084.2; Dated Oct. 31, 2024.

* cited by examiner

SEMICONDUCTOR DEVICE INCLUDING A DIELECTRIC LAYER BETWEEN A SOURCE/DRAIN REGION AND A SUBSTRATE

PRIORITY CLAIM

The present application is a continuation application of U.S. patent application Ser. No. 17/552,500, filed on Dec. 16, 2021, now U.S. Pat. No. 11,765,878, which is a continuation of U.S. patent application Ser. No. 15/931,658, filed on May 14, 2020, now U.S. Pat. No. 11,239,244, issued on Feb. 1, 2022, which claims priority to U.S. Application No. 62/867,315, filed Jun. 27, 2019, all of which are incorporated by reference herein in their entireties.

FIELD

The technology described in this disclosure relates generally to electronic systems and more particularly to increasing read margins of electronic devices using a partial buried insulator (BI) nano-sheet device.

BACKGROUND

Metal-oxide-semiconductor field-effect transistor (MOSFET) is a common semiconductor device used in both digital and analog circuits, including static random-access memory (SRAM) devices. MOSFETs are typically used for switching and amplifying electronic signals within electronic devices. A typical MOSFET includes a source, drain, and gate electrode. Energizing of the gate electrode causes current to flow from the source to the drain through a channel region. A gate electrode is characterized by a channel length and width. As electronic devices become smaller and smaller, the channel length of a MOSFET is reduced in size. Such reduction in channel length, however, reduces transistor performance as it is more difficult to control the channel region.

A fin field effect transistor (FinFET) is three-dimensional (3D) multi-gate MOSFET that provides more control over the channel region. With a FinFET design, a thin fin of silicon acts as a channel and it is encased by a gate electrode. It is this 3D structure that facilitates more control over the channel region. The reduction in gate length, however, can cause short channel effects such as leakage currents, surface scattering, velocity saturation, impact ionization, threshold voltage variations, and/or hot carrier effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
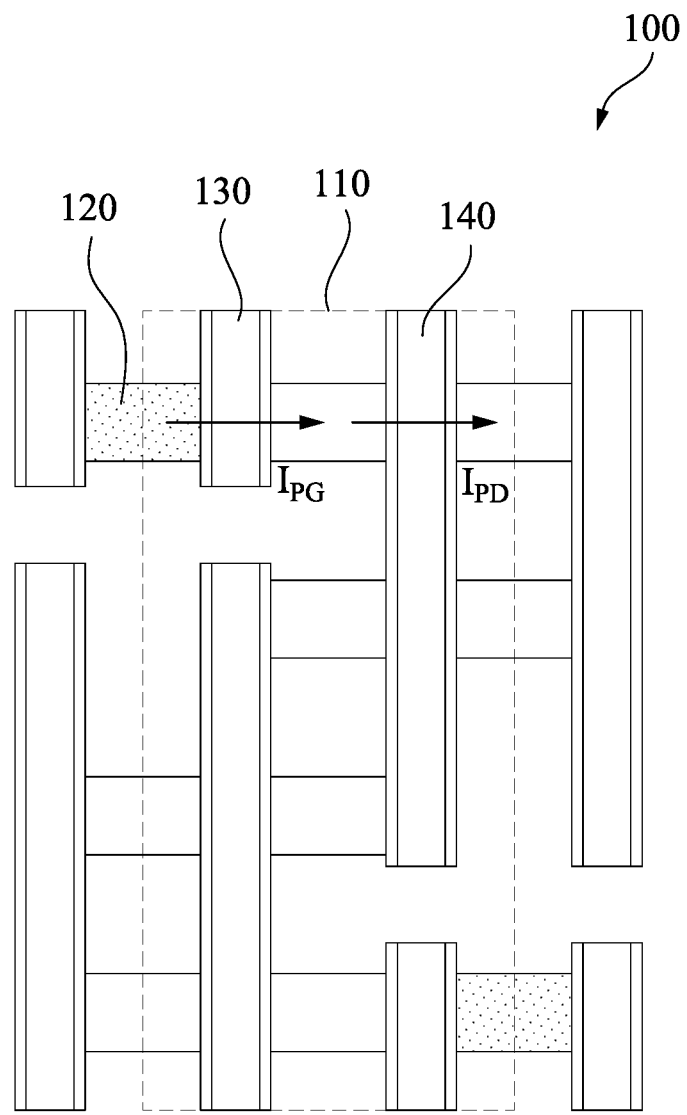
FIG. 1 is a top view of an exemplary portion of a SRAM device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In FinFET devices, a reduction in gate length can make a MOSFET device susceptible to a number of short channel effects such as leakage currents, surface scattering, velocity saturation, impact ionization, threshold voltage variations, and/or hot carrier effects. A nano-sheet device can provide an alternative, which in some examples, can have stronger gate controllability over a FinFET. Typically, both FinFET and nano-sheet FETs utilize read/write assist circuits such as sense amplifiers, negative voltage bias circuits, and/or selective pre-charge circuits to improve read performance. Devices and methods as described herein include eliminate the need for a read assist circuit through the use of a partial BI nano-sheet device.

SRAM devices are computer memory devices that are made up transistors such as MOSFETs, FinFETs, and/or nano-sheet FETs. An array of SRAM bitcells along with various control circuitry can be combined together into a SRAM macro. In an SRAM macro, additional read and/or write assist circuits may be required due to the use of FinFET and/or nano-sheet FETs as these devices are sensitive to current. A read margin is a metric that is used to evaluate read performance of an SRAM bitcell. The read margin can be characterized by a β-ratio which is a ratio between to currents flowing through some transistors of the SRAM bitcell. The higher the β-ratio, the better the SRAM bitcell performs read operations. When the β-ratio is a low value, additional circuitry can be used with the SRAM bitcell to increase its read performance. More specifically, a read assist circuit can increase that read performance. Additional circuitry in turn means more space within a device that may or may not be available. Devices described herein in some embodiments include a SRAM bitcell having a partial nano-sheets which enables it to a read assist-free SRAM. Such device includes a BI layer beneath a source region or a drain region of a SRAM bitcell and nano-sheets that separate the source region and the drain region from each other. In other words, the SRAM bitcell as described in some embodiments uses a BI layer to increase the β-ratio, obviating the need for a read assist circuit and saving room within the device.

Figure 2:
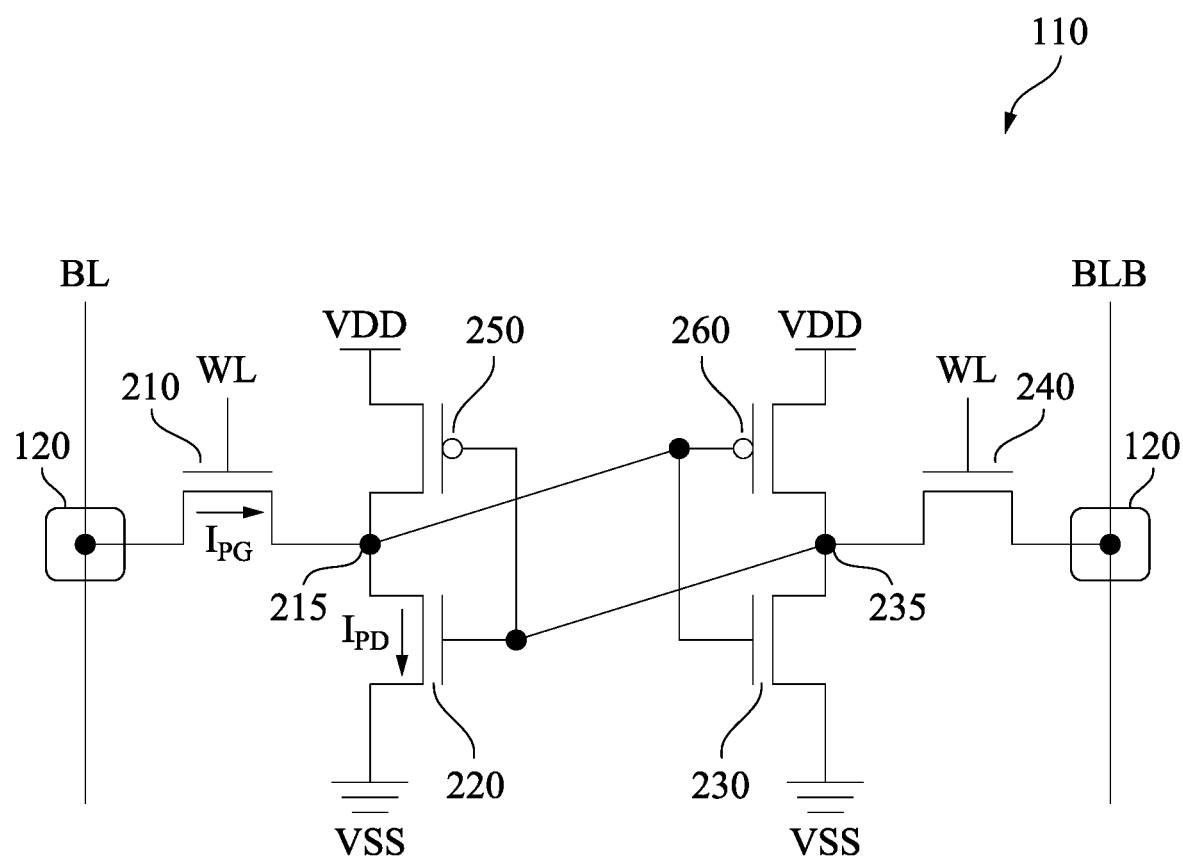
FIG. 2 is a schematic illustration of the exemplary SRAM bitcell of FIG. 1 in accordance with various embodiments of the present disclosure.

FIG. 1 is a top view of an exemplary portion of a SRAM device 100 in accordance with various embodiments of the present disclosure. The portion of SRAM device 100 as illustrated includes a SRAM bitcell 110. As a current, $I_{PG}$, flows across gate 130, it becomes degraded such that it is smaller than the current, $I_{PD}$, flowing through gate 140. Such degradation occurs, in part, as BI layer 120 is made up of dielectric materials. This makeup reduces a number of ions within the device as lack of a full source/drain region that are doped. Dielectric materials are insulating materials that inhibit current flow. In other words, the flow of current is minimal through a dielectric material. A β-ratio of an SRAM bitcell can be characterized by the following equation:

$$\beta = \frac{I_{PD}}{I_{PG}}, \quad (1)$$

where $I_{PG}$ is a current through a transistor coupled to a bitline of the SRAM bitcell and $I_{PD}$ is a current through another transistor of an inverter of the SRAM bitcell, both of which are explained in more detail in FIG. 2. Because BI layer 120 degrades $I_{PG}$, the value of $I_{PG}$ is less than $I_{PD}$. Dividing a larger number by a smaller one results in a larger number for the β-ratio of SRAM bitcell 110. With a large β-ratio, the read performance of SRAM bitcell 110 is good and no additional circuitry to assist with read performance is required.

FIG. 2 is a schematic illustration of the exemplary SRAM bitcell 110 of FIG. 1 in accordance with various embodiments of the present disclosure. SRAM bitcell 110 is a six transistor (6T) SRAM having NMOS transistors 210, 220, 230, 240 and PMOS transistors 250, 260. When powered, SRAM bitcell 110 stores a single bit of information. Transistors 210, 240 couple a pair of data lines (e.g., bitlines BL/BLB) to storage nodes 215, 235, respectively. A supply voltage, VDD, provides a positive voltage (e.g., 0.6-3.0 V) to PMOS transistors 250, 260. A second supply voltage, VSS, can be set to ground or a negative voltage. NMOS transistors 220, 230 are coupled to the second supply voltage and to each other via storage nodes 215, 235 depending on the state of the SRAM bitcell 110. SRAM bitcell 110 is a latch that will retain its data state indefinitely so long as the supplied power is sufficient to operate the components within SRAM bitcell 110. PMOS transistor 250 and NMOS transistor 220 together form a complementary metal-oxide-semiconductor (CMOS) inverter. PMOS transistor 260 and NMOS transistor 230 together form another CMOS inverter. The two CMOS inverters are cross-coupled together and operate to reinforce the stored charge on the storage nodes 215, 235 continuously. The two storage nodes 215, 235 are inverted one from the other. When storage node 215 is a logical "1", usually a high voltage, storage node 235 is at the same time a logical "0", usually a low voltage, and vice versa. When SRAM bit cell 110 is written to, complementary write data signals are placed on the bitlines BL/BLB. A positive control signal on a wordline WL is coupled to the gate of both NMOS transistors 210, 240. NMOS transistors 220, 230 and PMOS transistors 250, 260 are sized such that the data on the bitlines BL/BLB may overwrite the stored data and thus write the SRAM bitcell 110.

A SRAM bitcell 110 is read when a voltage is applied to bitlines BL/BLB. Once the voltage is applied to bitlines BL/BLB, a voltage is applied to the wordline WL. One of the bitlines BL/BLB will be pulled down by the bitcell operation. That pull-down is facilitated by the electrical coupling of the bitlines BL/BLB to a BI layer 120, as described in more detail in FIG. 7. $I_{PG}$ is defined as the current flow through NMOS transistor 210. $I_{PD}$ is defined as the current flowing through NMOS transistor 220. As current $I_{PG}$ flows through transistor 210, it is electrically impacted by BI layer 120 and reduced in amperage. The current $I_{PD}$ is greater than that of $I_{PG}$. As such, the β-ratio of Equation (1) is large, which indicates that no additional read assist circuitry is required.

Figure 3:
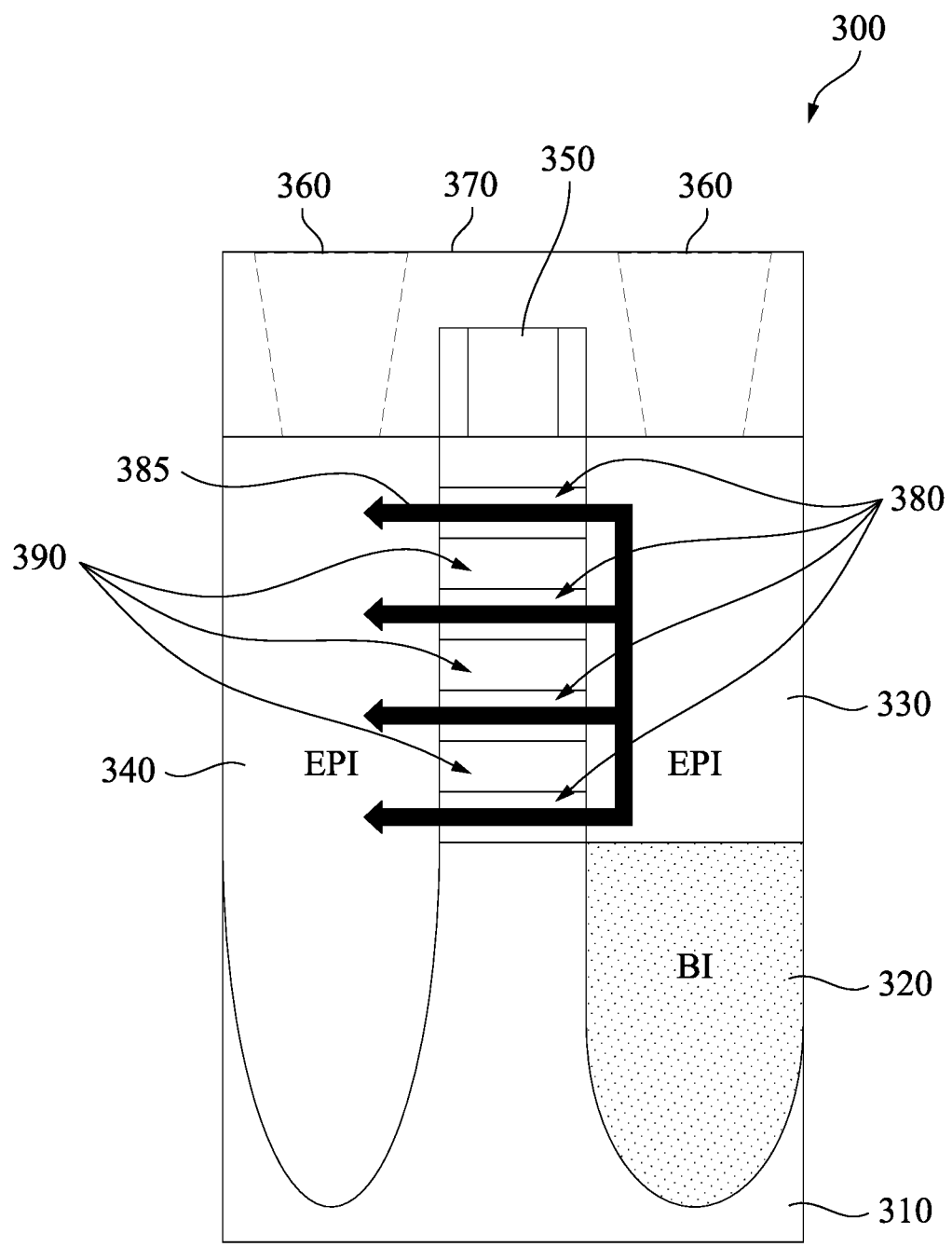
FIG. 3 is a cross-sectional view of an exemplary nano-sheet transistor that may be used in an exemplary SRAM bitcell in accordance with various embodiments of the present disclosure.

FIG. 3 is a cross-sectional view of an exemplary nano-sheet transistor 300 that may be used in an exemplary SRAM bitcell in accordance with various embodiments of the present disclosure. The nano-sheet transistor 300 includes a substrate 310, a BI layer 320, a source region 330, a drain region 340, a gate 350, contacts 360, dielectric material 370, nano-sheets 380, and gate electrodes 390. In the embodiment illustrated in FIG. 3, BI layer 320 can be formed beneath source region 330. When the nano-sheet transistor 300 is operating, drive current flows between source region 330 and drain region 340. The presence of BI layer 320 degrades this drive current, resulting in a low current value of $I_{PG}$ which in turn increases the β-ratio as previously described in FIGS. 1-2. As a result, nano-sheet transistor 300 does not need to be used in conjunction with any read assist circuitry.

Substrate 310 can be made up of any number of appropriate semiconductor materials such as Si, P, Ge, Ga, SiGe, and/or InAs or any combination thereof. BI layer 320 can be made up of any number of appropriate dielectric materials such as $Si_3N_4$, $SiO_2$, $Al_2O_3$, $HfO_2$, $Ta_2O_5$, and/or $TiO_2$ or any combination thereof. Source region 330 and drain region 340 are epitaxially-grown doped regions. As known in the art, such regions are interchangeable. Nano-sheets 380 and gate electrodes 390 can be alternatively stacked on top of each other, positioned (i) vertically between a top surface of BI layer 320 and a bottom surface of dielectric material 370 and (ii) horizontally between source region 330 and drain region 340. The nano-sheets act as a channel between the source region 330 and drain region 340. Driving current for the nano-sheet transistor 300 flows along current pathways 385 through nano-sheets 380. Nano-sheets 380 can be made up of any number of appropriate semi-conductor materials such as Si, P, Ge, Ga, SiGe, and/or InAs or any combination thereof. Gate electrodes 390 are conductive components that can surround a gate dielectric (not shown in FIG. 3). Although not shown, the gate dielectric surrounds nanosheets 380 and is positioned between the nanosheets 380 and the gate electrodes 390. The gate dielectric can be made up of any number of appropriate dielectric materials such as $Si_3N_4$, $SiO_2$, $Al_2O_3$, $HfO_2$, $Ta_2O_5$, and/or $TiO_2$ or any combination thereof. Gate electrodes 390 can be made up of any number of appropriate dielectric materials such as $Si_3N_4$, $SiO_2$, $Al_2O_3$, $HfO_2$, $Ta_2O_5$, and/or $TiO_2$ or any combination thereof. Gate 350 can be made up of any number of appropriate conductor materials such as Cu, W, CO, Ru or any combination thereof. Similarly, contacts 360 can be made up of any number of appropriate conductor materials such as Cu, W, CO, Ru or any combination thereof.

Figure 4:
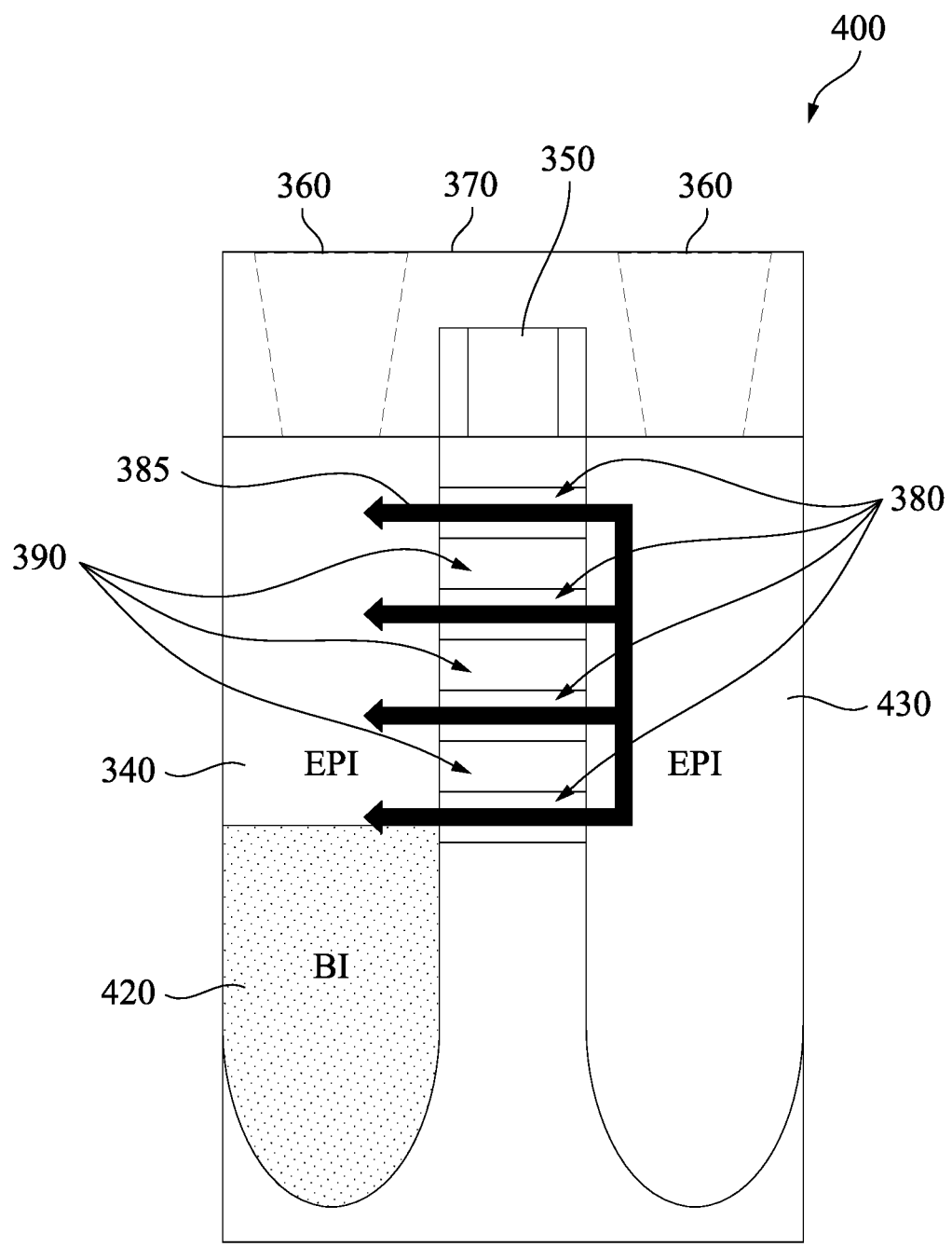
FIG. 4 is a cross-sectional view of another exemplary nano-sheet transistor that may be used in an exemplary SRAM bitcell in accordance with various embodiments of the present disclosure.

FIG. 4 is a cross-sectional view of another exemplary nano-sheet transistor 400 that may be used in an exemplary SRAM bitcell in accordance with various embodiments of the present disclosure. In the embodiment illustrated in FIG. 4, the BI layer 420 is formed beneath a drain region 340, rather than the source region 430.

Figure 5:
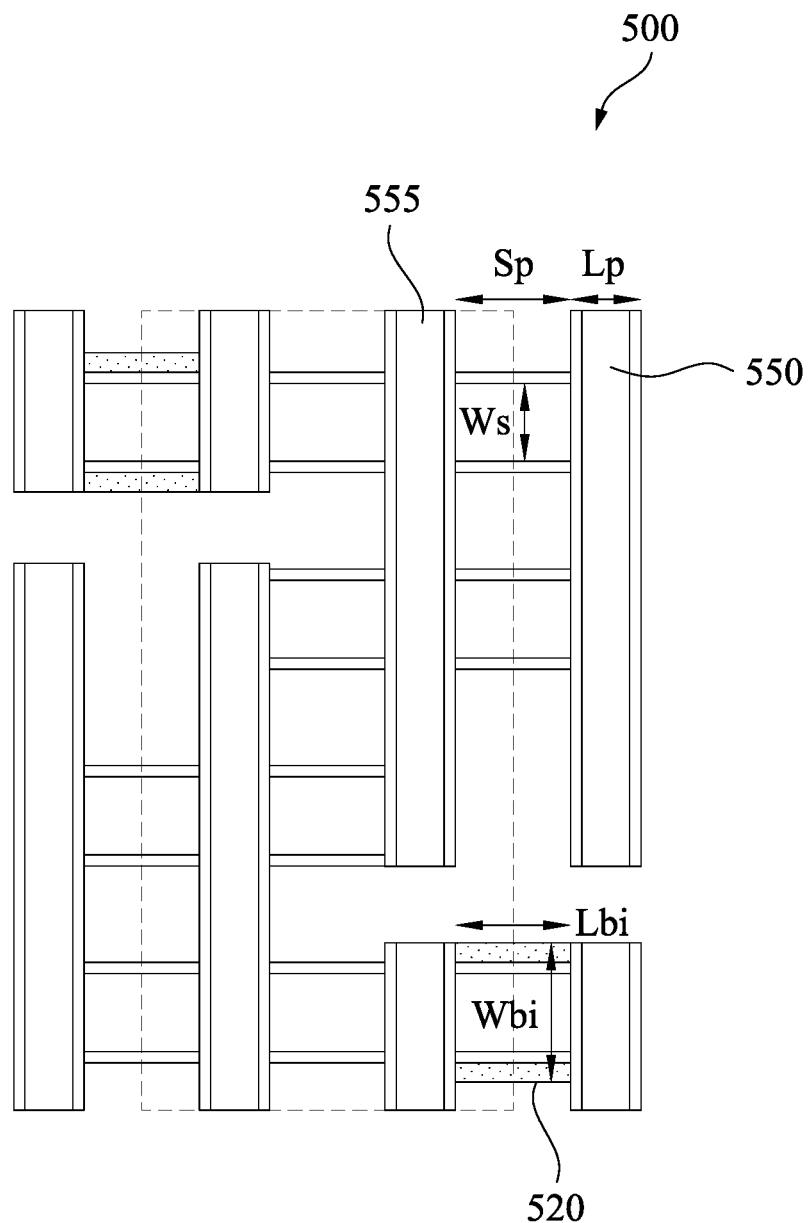
FIG. 5 is a top view of an exemplary portion of SRAM device in accordance with various embodiments of the present disclosure.

FIG. 5 is a top view of an exemplary portion of SRAM device 500 in accordance with various embodiments of the present disclosure. Poly or gate 550 has an associated length, Lp. A pitch or spacing of poly or gate 550 to another gate 555, Sp, is less than a large magnitude of the poly length, Lp, (e.g., ~20 times Lp) and is greater than or equal to at least double the poly length (e.g., ~2 times Lp). In other words, the relationship between the poly length, Lp, and poly space, Sp, can be expressed by:

$$20Lp > Sp \geq 2Lp. \quad (2)$$

Poly or gate 550 has a depth, Dp, (not shown) that is less than a magnitude of the poly length, Lp, (e.g., ~50 times Lp) but greater than a different magnitude of poly length, Lp (e.g., ~5 times Lp). In other words, the relationship between the poly depth and poly length can be expressed by:

$$50Lp > Dp > 5Lp. \quad (3)$$

BI layer 520 has a length, Lbi, which is greater than or equal to a poly space, Sp, between gates. In other words, the relationship between the length of the BI layer 520 and the poly space, Sp, can be expressed by:

$$Lbi \geq Sp. \quad (4)$$

BI layer 520 is formed above a substrate and has a depth, Dbi, (not shown) that is less than a magnitude of poly length, Lp, (e.g., ~30 times Lp) but greater than approximately half of the poly depth, Dp (e.g., 0.5 times Dp). In other words, the relationship between the depth of BI layer 520, Dbi, the poly length, Lp, and poly depth, Dp, can be expressed by:

$$30Lp > Dbi > 0.5Dp. \quad (5)$$

Nano-sheet 380 has a sheet width, Ws, that is less than or equal to a magnitude of the poly length, Lp (e.g., ~10 times Lp) and is greater than or equal to approximately half of the poly length, Lp (e.g., 0.5 times Lp). In other words, the relationship between the sheet width, Ws, and the poly length, Lp, can be expressed by:

$$10Lp \geq Ws \geq 0.5Lp. \quad (6)$$

BI layer 520 has a width, Wbi, which is greater than or equal to a sheet width, Ws, of nano-sheet 380. In other words, the relationship between the width of BI layer 520, Wbi, and the sheet width, Ws, can be expressed by:

$$Wbi \geq Ws. \quad (7)$$

Figure 6:
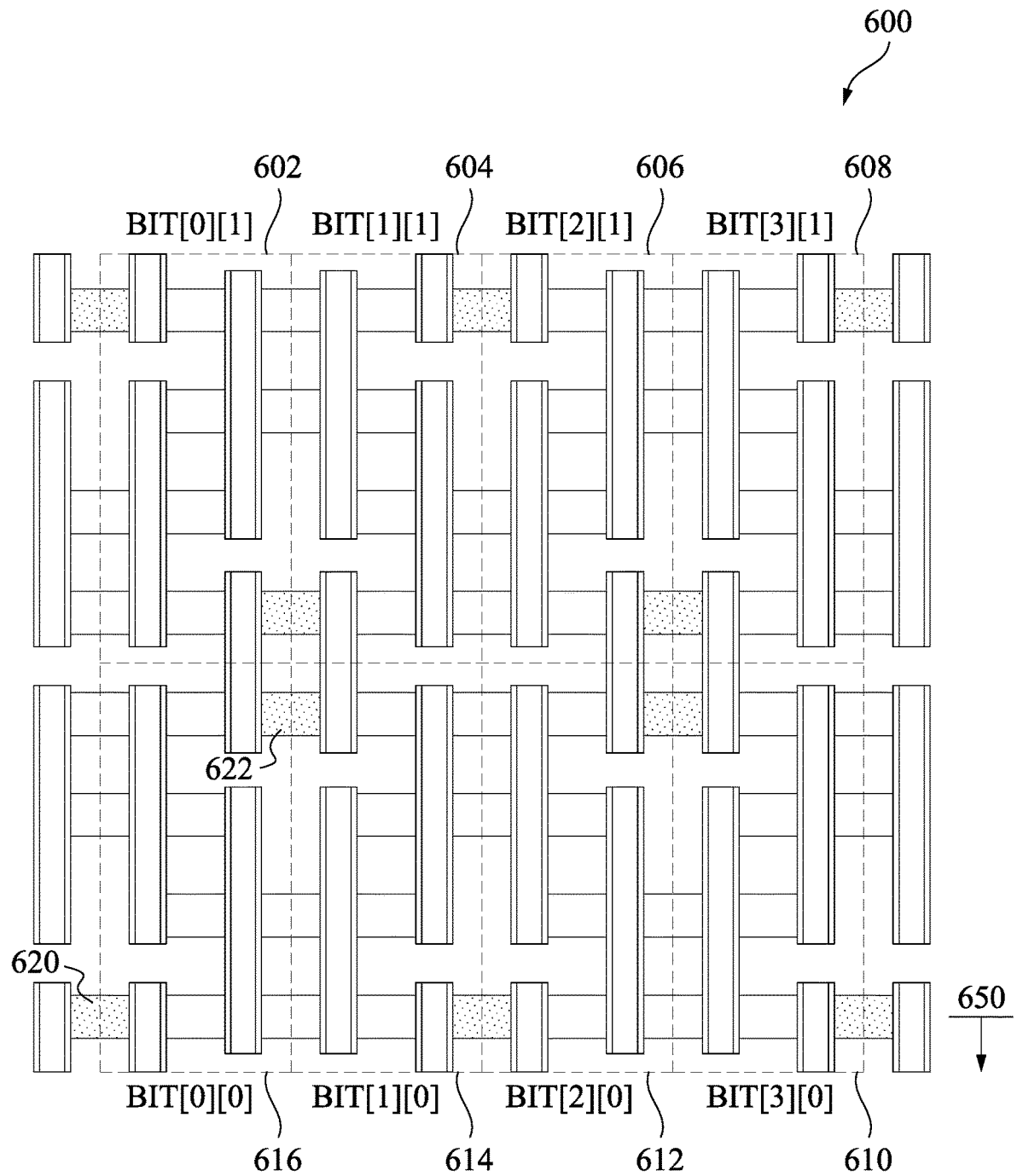
FIG. 6 is an exemplary SRAM device having an array of SRAM bitcells in accordance with various embodiments of the present disclosure.

FIG. 6 is an exemplary SRAM device 600 having an array of SRAM bitcells 602, 604, 606, 608, 610, 612, 614, 616 in accordance with various embodiments of the present disclosure. As illustrated, at least two BI layers span each bitcell. For example, bitcell 602 includes a portion of BI layer 620 and a portion of BI layer 622. In other words, each BI layer 620, 622 spans multiple bitcells.

Figure 7:
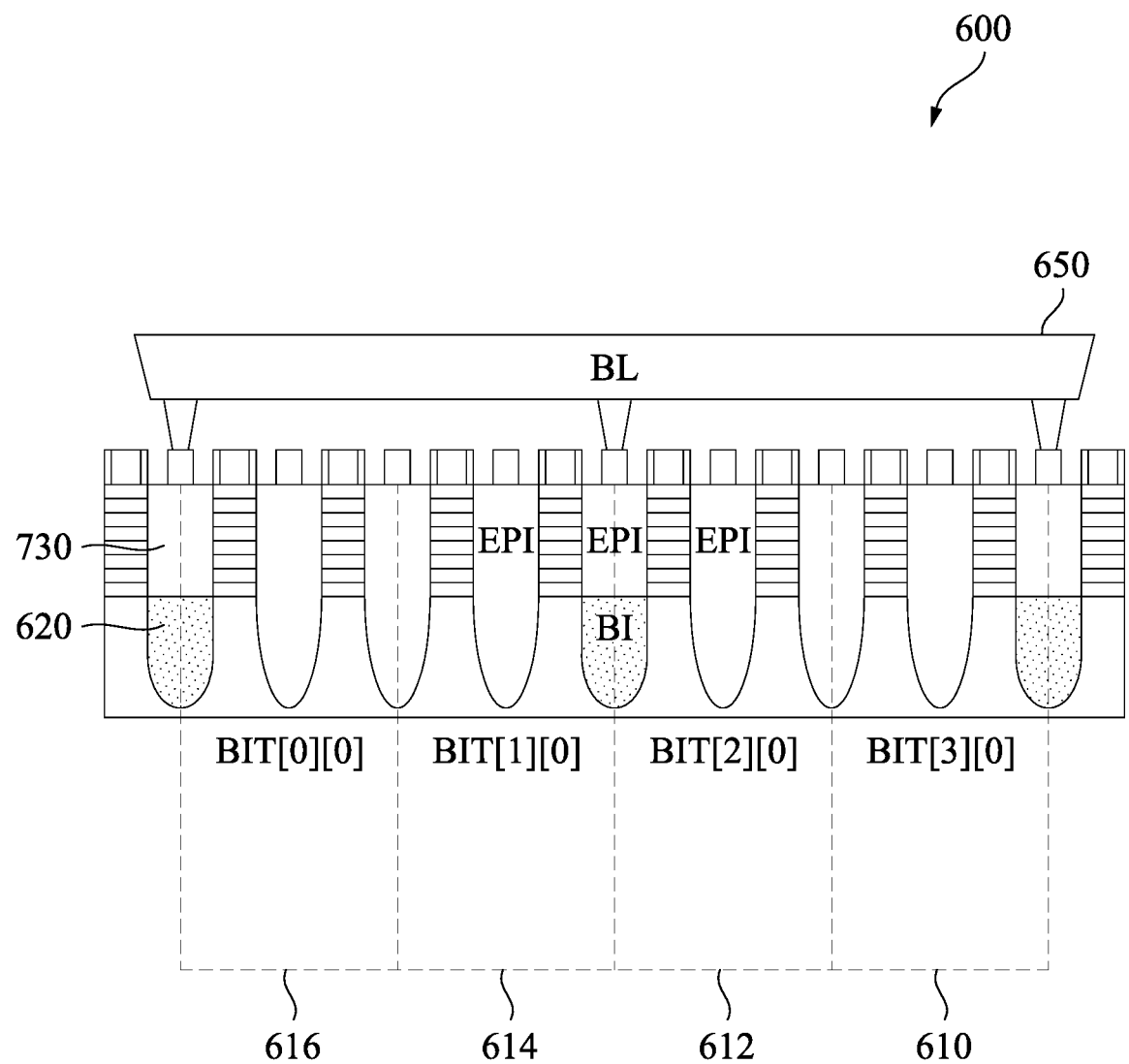
FIG. 7 is a cross-sectional view of the exemplary SRAM device of FIG. 6 in accordance with various embodiments of the present disclosure.

FIG. 7 is a cross-sectional view about axis 650 of the exemplary SRAM device 600 of FIG. 6 in accordance with various embodiments of the present disclosure. BL 650 couples together bitcells 610, 612, 614, 616. BL 650 also electrically couples to each BI layer within each bitcell. For example, BL 650 electrically couples to BI layer 620 of bitcell 616 via source/drain region 730. It is through this electrical coupling that the current flow $I_{PD}$, as described in FIGS. 1-2, becomes degraded.

Figure 8:
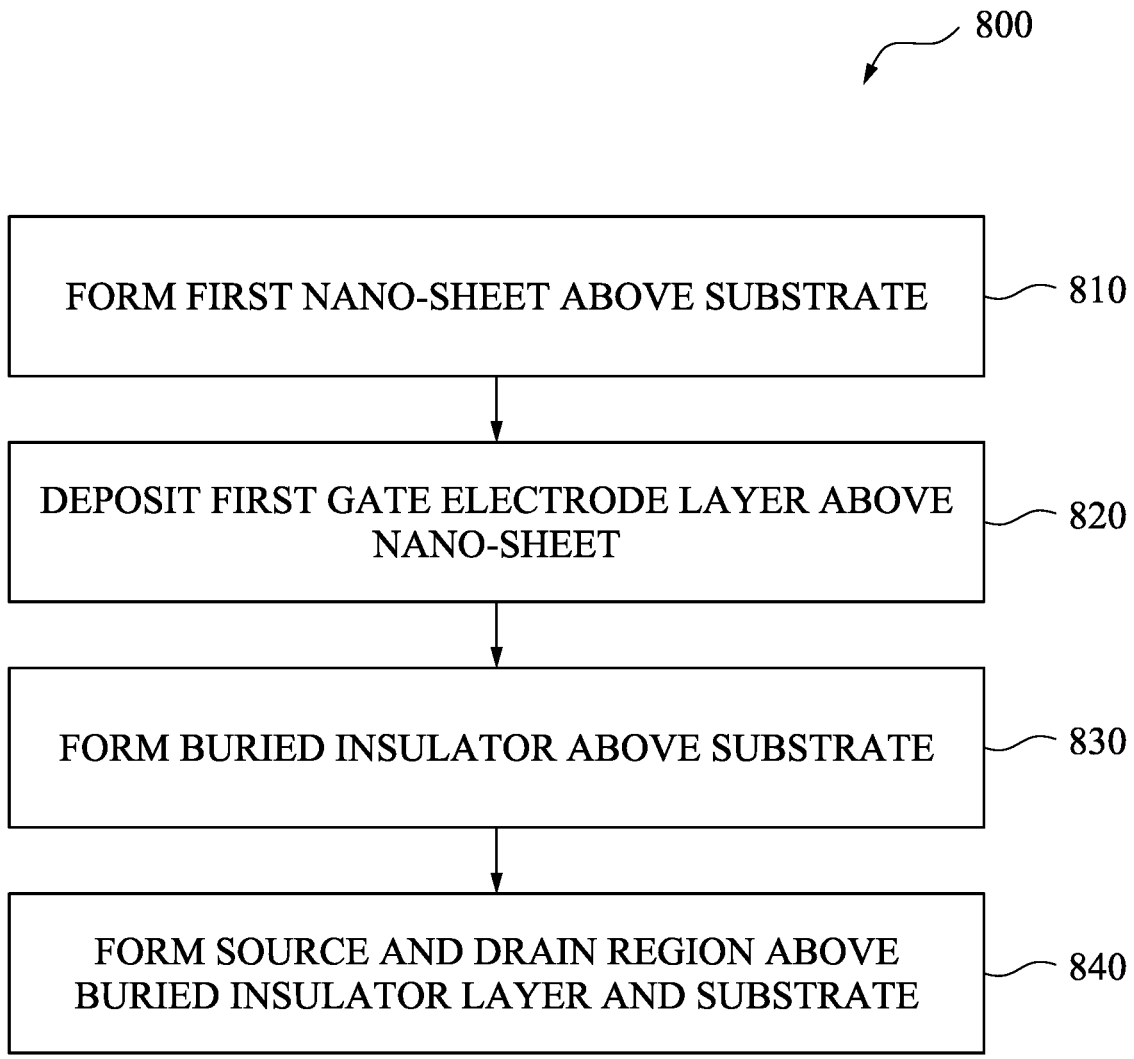
FIG. 8 is a flow chart of an exemplary method of forming a SRAM device having a partial BI layer and nano-sheets in accordance with various embodiments of the present disclosure.

FIG. 8 is a flow chart 800 of an exemplary method of forming a SRAM device having a partial BI layer and nano-sheets in accordance with various embodiments of the present disclosure. The method is applicable to a wide variety of underlying structures. But for ease of understanding is described in relation to FIGS. 3-4 and 8. A first nano-sheet 380 is formed above the substrate 310. The first nano-sheet 380 can be epitaxial formed over the substrate 310 (step 810). A gate electrode layer 390 is formed over the first nano-sheet 380. The gate electrode layer 390 is deposited using chemical vapor deposition (CVD), including low pressure CVD (LPCVD) and plasma enhanced CVD (PECVD), physical vapor deposition (PVD), atomic layer deposition (ALD), or other suitable processes (step 820). A BI layer 320 is formed above the substrate 310 (step 830). A source region and a drain region are formed above the substrate 310 and the BI layer 320 (step 840). The first nano-sheet 380 is (i) horizontally positioned between the source region and the drain region and (ii) vertically above the BI layer 320.

Although a 6T SRAM bitcell is described throughout the figures, one of skill in the art can appreciate that any type of bitcell can be implemented using the teachings herein. These bitcells can included, but are not limited to, 7 transistor (7T), 8 transistor (8T), 9 transistor (9T), and/or 10 transistor (10T) bitcells.

Use of the various circuits and configurations as described herein can provide a number of advantages. For example, the use of an embedded BI layer beneath a source/drain region along with a plurality of nano-sheets decreases a current flowing through a first transistor of an SRAM bitcell. This reduction in current improves a beta ratio of the SRAM bitcell. Such improvement indicates that the read performance of the SRAM bitcell is high and no additional read assist circuits are needed. Eliminating the need for any read assist circuitry saves space within a device that can be utilized for other circuitry and/or can decrease the overall sizing of the device.

In one embodiment, a semiconductor device includes a source region and a drain region formed above a substrate. A BI layer is formed beneath either the source region or the drain region. A first nano-sheet is formed (i) horizontally between the source region and the drain region and (ii) vertically above the BI layer. Current flow through the BI layer increases a beta ratio comprising a ratio of the current flow.

In another embodiment, a SRAM device includes a plurality of SRAM bitcells. Each SRAM bitcell has a portion of a BI layer formed beneath a first source/drain region and a plurality of nano-sheet layers separating the first source/drain region from a second source/drain region. A bitline couples together the plurality of the SRAM bitcells. The bitline electrically coupled to the portion of the BI layer.

In yet another embodiment, a method includes forming a first nano-sheet above a substrate. A first gate electrode layer is deposited above the first nano-sheet. A BI layer is formed above the substrate. A source region and a drain region are formed above the BI layer and the substrate. The BI layer is positioned (i) horizontally between the source region and the drain region and (ii) vertically above the BI layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first transistor above a substrate and including:
a first source/drain region;
a layer between the first source/drain region and the substrate, wherein the layer is made of a dielectric material;
a second source/drain region in contact with the substrate; and
a channel region in contact with the substrate.

2. The semiconductor device of claim 1, wherein the layer is buried in the substrate.

3. The semiconductor device of claim 1, wherein the channel region is between the first source/drain region and the second source/drain region and is above a topmost surface of the substrate.

4. The semiconductor device of claim 1, further comprising a gate electrode on top and bottom surfaces of the channel region.

5. The semiconductor device of claim 1, wherein the channel region includes a plurality of nano-sheets.

6. The semiconductor device of claim 5, wherein each of the nano-sheets has a sheet width and the layer has a width substantially equal to or greater than the sheet width.

7. The semiconductor device of claim 1, wherein the first transistor includes a gate and the layer has a depth greater than half of a depth of the gate.

8. The semiconductor device of claim 1, further comprising a second transistor adjacent the first transistor, wherein the layer has a length substantially equal to or greater than a space between a gate of the first transistor and a gate of the second transistor.

9. A memory device comprising:
a plurality of bitcells, each bitcell including:
a first transistor above a substrate and having
a first source/drain region,
a first layer between the first source/drain region and the substrate and made of a different material than the substrate,
a second source/drain region in contact with the substrate, and
a channel region in contact with the substrate; and
a first bitline coupled to the first source/drain region of the first transistor.

10. The memory device of claim 9, wherein the first layer is buried in the substrate.

11. The memory device of claim 9, further comprising the channel region formed between the first source/drain region and the second source/drain region and above a top surface of the substrate.

12. The memory device of claim 9, further comprising a gate electrode on top and bottom surfaces of the channel region.

13. The memory device of claim 9, further comprising an inverter connected to the second source/drain region of the first transistor.

14. The memory device of claim 9, wherein each bitcell further includes:
a second transistor above the substrate and having
a first source/drain region,
a second layer between the first source/drain region and the substrate and made of a different material than the substrate, and
a second source/drain region in contact with the substrate; and
a second bitline coupled to the first source/drain region of the second transistor.

15. The memory device of claim 14, further comprising an inverter connected to the second source/drain region of the second transistor.

16. The memory device of claim 14, wherein each of the first and second transistors has a gate connected to a wordline.

17. A method comprising:
generating a first current that flows through a first transistor of a bitcell, the first transistor having a first source/drain region connected to a bit line of the bitcell, and a layer being between the first source/drain region and a substrate, wherein the layer is made of a different material than the substrate; and
generating a second current that flows through a second transistor of the bitcell, the second transistor being connected to a second source/drain region of the first transistor.

18. The method of claim 17, further comprising performing a read operation on the bitcell without requiring read assist circuitry.

19. The method of claim 17, wherein the second transistor is further connected to a third transistor and the second and third transistors form an inverter.

20. The method of claim 17, wherein the first transistor has a gate connected to a wordline.

* * * * *